United States Patent
Park et al.

(10) Patent No.: US 7,875,559 B2
(45) Date of Patent: Jan. 25, 2011

(54) METHOD OF MANUFACTURING P-TYPE ZNO SEMICONDUCTOR LAYER USING ATOMIC LAYER DEPOSITION AND THIN FILM TRANSISTOR INCLUDING THE P-TYPE ZNO SEMICONDUCTOR LAYER

(75) Inventors: Sang Hee Park, Daejeon (KR); Chi Sun Hwang, Daejeon (KR); Hye Yong Chu, Daejeon (KR); Jeong Ik Lee, Gyeonggi (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 518 days.

(21) Appl. No.: 11/970,836

(22) Filed: Jan. 8, 2008

(65) Prior Publication Data

US 2008/0164476 A1   Jul. 10, 2008

(30) Foreign Application Priority Data

Jan. 9, 2007    (KR) .................. 10-2007-0002521
Jun. 12, 2007   (KR) .................. 10-2007-0057097

(51) Int. Cl.
  *H01L 21/00*  (2006.01)
  *H01L 21/469* (2006.01)
  *H01L 21/31*  (2006.01)
(52) U.S. Cl. ................... 438/762; 438/45; 438/104; 438/758; 438/765; 438/778; 257/E21.461; 257/E21.462; 257/E21.463
(58) Field of Classification Search .......... 257/E21.461, 257/E21.562, E21.463
See application file for complete search history.

(56) References Cited

U.S. PATENT DOCUMENTS 7,563,715 B2 * 7/2009 Haukka et al. .............. 438/680

(Continued)

FOREIGN PATENT DOCUMENTS

JP    2003-86808 A    3/2003

(Continued)

OTHER PUBLICATIONS

Guotong Du, et al; "Preparation of intrinsic and N-doped *p*-type ZnO thin films by metalorganic vapor phase epitaxy," Applied Physics Letters 87, pp. 213103-1 to 213103-3; (2005).

(Continued)

*Primary Examiner*—Charles D Garber
*Assistant Examiner*—Mohsen Ahmadi
(74) *Attorney, Agent, or Firm*—Ladas & Parry LLP

(57) ABSTRACT

Provided are a method of manufacturing a transparent N-doped p-type ZnO semiconductor layer using a surface chemical reaction between precursors containing elements constituting thin layers, and a thin film transistor (TFT) including the p-type ZnO semiconductor layer. The method includes the steps of: preparing a substrate and loading the substrate into a chamber; injecting a Zn precursor and an oxygen precursor into the chamber, and causing a surface chemical reaction between the Zn precursor and the oxygen precursor using an atomic layer deposition (ALD) technique to form a ZnO thin layer on the substrate; and injecting a Zn precursor and an nitrogen precursor into the chamber, and causing a surface chemical reaction between the Zn precursor and the nitrogen precursor to form a doping layer on the ZnO thin layer.

10 Claims, 4 Drawing Sheets

U.S. PATENT DOCUMENTS

| | | | |
|---|---|---|---|
| 7,723,154 B1 * | 5/2010 | Adekore et al. | 438/104 |
| 2003/0175411 A1 * | 9/2003 | Kodas et al. | 427/58 |
| 2004/0023461 A1 * | 2/2004 | Ahn et al. | 438/287 |
| 2005/0170971 A1 | 8/2005 | Yata et al. | |
| 2006/0196418 A1 * | 9/2006 | Lindfors et al. | 118/715 |
| 2008/0206982 A1 * | 8/2008 | Suzuki | 438/627 |
| 2008/0242077 A1 * | 10/2008 | Clark | 438/622 |
| 2009/0130858 A1 * | 5/2009 | Levy | 438/765 |

FOREIGN PATENT DOCUMENTS

| | | |
|---|---|---|
| JP | 2007-165805 A | 6/2007 |
| KR | 2003-0070675 A | 9/2003 |
| KR | 2005-0043362 A | 5/2005 |

OTHER PUBLICATIONS

Y.W. Heo, et al; Transport properties of phosphorus-doped ZnO thin films, Applied Physics Letters, vol. 83, No. 6, Aug. 11, 2003, pp. 1128-1130.

* cited by examiner

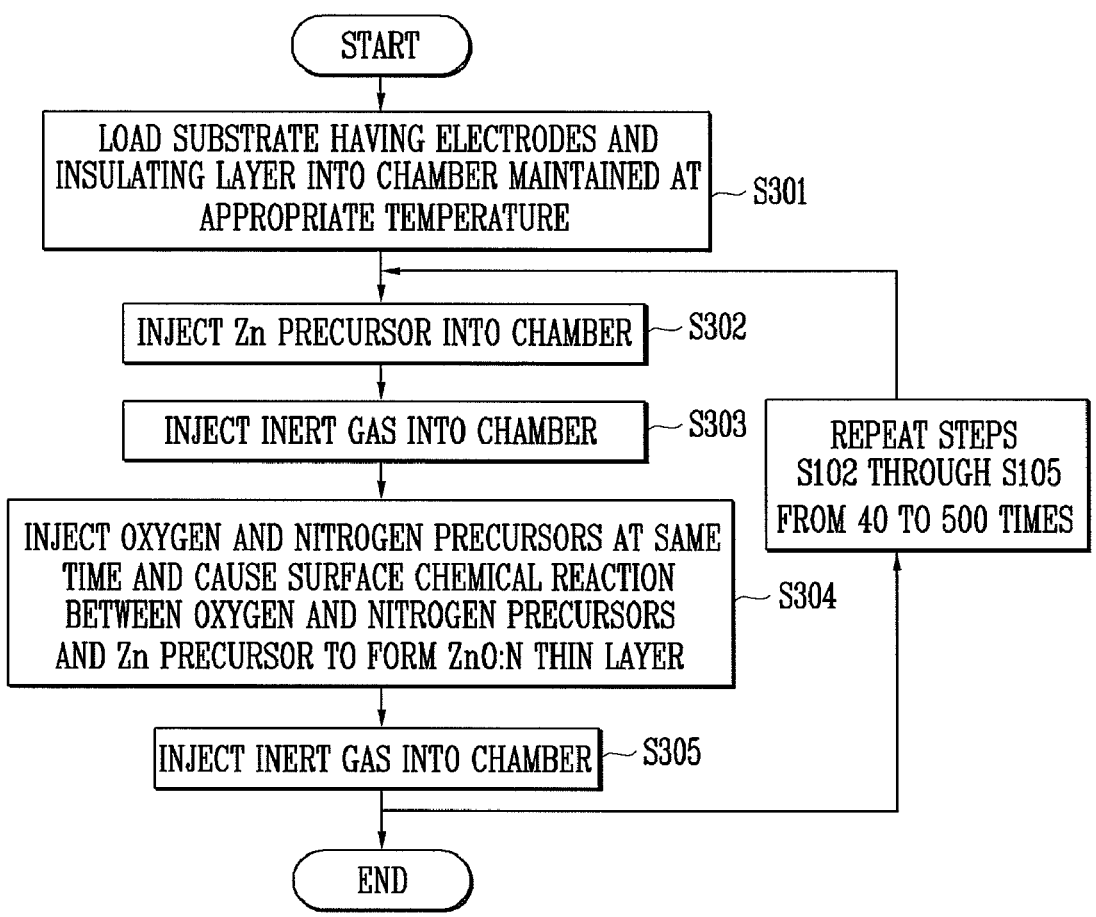

METHOD OF MANUFACTURING P-TYPE ZNO SEMICONDUCTOR LAYER USING ATOMIC LAYER DEPOSITION AND THIN FILM TRANSISTOR INCLUDING THE P-TYPE ZNO SEMICONDUCTOR LAYER

CROSS-REFERENCE TO RELATED APPLICATION

This application claims priority to and the benefit of Korean Patent Application Nos. 2007-2521, filed Jan. 9, 2007, and 2007-57097, filed Jun. 12, 2007, the disclosures of which are incorporated herein by reference in their entirety.

BACKGROUND

1. Field of the Invention

The present invention relates to a method of manufacturing a p-type ZnO semiconductor layer using an atomic layer deposition (ALD) technique and a thin film transistor (TFT) including the p-type ZnO semiconductor layer and, more particularly, to a method of manufacturing a p-type ZnO semiconductor layer including a $Zn_3N_2$ layer or a ZnO:N layer formed through a surface chemical reaction between a Zn precursor and an nitrogen precursor on a ZnO thin layer formed through a surface chemical reaction between an oxygen precursor and a Zn precursor, and a TFT including the p-type ZnO semiconductor layer.

The present invention has been produced from the work supported by the IT R&D program of MIC (Ministry of Information and Communication)/IITA (Institute for Information Technology Advancement) [2006-S-079-01, Smart window with transparent electronic devices] in Korea.

2. Discussion of Related Art

In modern times, the demand for electronic devices that can be used any time any place is widespread. Among the electronic devices, thin film transistors (TFTs) are being widely used not only for semiconductor devices but also for display devices, radio-frequency identification (RFID), and sensors. The TFTs may be classified into amorphous silicon (a-Si) transistors and polysilicon (poly-Si) transistors. Also, organic TFTs using organic semiconductors have been developed lately.

In recent years, development of TFTs using transparent oxide semiconductors having wide bandgaps has attracted much attention. Most research has been focused on n-type oxide semiconductor thin layers due to the fact that forming stable p-type oxide semiconductor thin layers is difficult. Specifically, in a p-type oxide semiconductor thin layer, a hole transport path is formed by oxygen 2 p orbital. It is typically known that oxygen orbital in an oxide is localized, so that effective hole mass is relatively large to cause a low hole mobility, and valence band minimum is very deep to preclude doping holes.

Currently known p-type oxide thin layers include a ZnO layer doped with nitrogen (N) or phosphorus (P) and a LnCuOCh (Ln: lanthanide, Ch: chalcogen) layer. The LnCuOCh has a disadvantage of low transparency, and the N- or P-doped ZnO layer has low reproducibility and low mobility. Also, in order to manufacture currently published ZnO-based p-type oxide semiconductors, a plasma-enhanced metal-organic vapor phase epitaxy deposition (MOVPED) (Appl. Phys. Lett., 87, 213103, 2005) process or a plasma laser deposition (PLD) (Appl. Phys. Lett., 83, 1128, 2003) process should be performed on a single crystalline substrate, such as a sapphire substrate, at a high temperature of 500° C. However, when a ZnO-based p-type oxide semiconductor thin layer is deposited using a MOVPED or PLD process at a high temperature of 500° C., defects may be generated due to oxygen vacancies formed in the ZnO-based p-type oxide semiconductor thin layer or the remaining Zn ions. Also, when the ZnO-based p-type oxide semiconductor thin layer is deposited using the MOVPED or PLD process, a deposition process should be followed by a high-temperature thermal process in order to activate a dopant. As a result, forming the ZnO-based p-type oxide semiconductor thin layer on a large area is difficult and costly, thus hindering manufacture of low-priced TFTs adequate for ubiquitous environments.

SUMMARY OF THE INVENTION

The present invention is directed to a method of manufacturing a low-priced p-type ZnO semiconductor layer having excellent characteristics using a simple process at a low temperature.

Also, the present invention is directed to a method of manufacturing a p-type ZnO semiconductor layer for an electronic device, which can inhibit formation of defects in the p-type ZnO semiconductor layer such as oxygen vacancies or interstitial Zn ions.

Further, the present invention is directed to a method of manufacturing a p-type ZnO semiconductor layer in which the p-type ZnO semiconductor layer may be formed on substrates other than a single crystalline substrate by causing a surface chemical reaction between precursors at a low temperature.

In addition, the present invention is directed to a thin film transistor (TFT) including a p-type ZnO semiconductor layer manufactured by the method according to the present invention.

One aspect of the present invention provides a method of manufacturing a p-type ZnO semiconductor layer for an electronic device. The method includes the steps of: preparing a substrate and loading the substrate into a chamber; injecting a Zn precursor and an oxygen precursor into the chamber, and causing a surface chemical reaction between the Zn precursor and the oxygen precursor using an atomic layer deposition (ALD) technique to form a ZnO thin layer on the substrate; and injecting a Zn precursor and an nitrogen precursor into the chamber, and causing a surface chemical reaction between the Zn precursor and the nitrogen precursor to form a doping layer on the ZnO thin layer.

The formation of the ZnO thin layer may include the steps of: a1) injecting the Zn precursor into the chamber to adsorb the Zn precursor on the substrate; a2) injecting an inert gas into the chamber to remove the remaining unadsorbed Zn precursor from the substrate; a3) injecting the oxygen precursor into the chamber, and causing a reaction between the oxygen precursor and the Zn precursor adsorbed on the substrate to form the ZnO thin layer; a4) injecting an inert gas into the chamber to remove the remaining unreacted oxygen precursor; and a5) repeating steps a1) through a4) plural times. Step a5) may be repeated forty to five-hundred times.

The formation of the doping layer on the ZnO thin layer may include the steps of: b1) injecting the Zn precursor on the substrate having the ZnO thin layer to adsorb the Zn precursor on the ZnO thin layer; b2) injecting an inert gas into the chamber to remove the remaining unadsorbed Zn precursor; b3) injecting an nitrogen precursor into the chamber, and causing a reaction between the nitrogen precursor and the Zn precursor adsorbed on the ZnO thin layer to form a $Zn_3N_2$ layer; b4) injecting an inert gas into the chamber to remove the remaining unreacted nitrogen precursor; and b5) repeating steps b1) through b4) one to ten times.

In the method, steps a1) through a5) and steps b1) through b5) may be repeated until the sum of the thicknesses of the ZnO thin layer and the $Zn_3N_2$ doping layer reaches about 8 to 100 nm.

Another aspect of the present invention provides a method of manufacturing a p-type ZnO semiconductor layer for an electronic device. The method includes the steps of: c1) preparing a substrate and loading the substrate into a chamber; c2) injecting a Zn precursor into the chamber, and adsorbing the Zn precursor on the substrate; c3) injecting an inert gas into chamber, and removing the remaining unadsorbed Zn precursor; and c4) injecting an oxygen precursor and a nitrogen precursor into the chamber at the same time, and causing a surface chemical reaction between the oxygen and nitrogen precursors and the Zn precursor adsorbed on the substrate to form an N-doped ZnO (ZnO:N) layer.

The number of times steps c2) through c4) are performed may depend on a desired thickness of the p-type ZnO semiconductor layer. That is, in order to obtain the desired thickness, steps c2) through c4) may be repeated a number of times equal to the sum obtained by dividing the desired thickness by a deposition rate at a given temperature. Specifically, steps c2) through c4) may be repeated plural times until the N-doped ZnO (ZnO:N) layer is formed to a thickness of, for example, about 8 to 100 nm.

The Zn precursor may be one selected from the group consisting of diethyl zinc and dimethyl zinc. The oxygen precursor may be one selected from the group consisting of water ($H_2O$), ozone ($O_3$), oxygen ($O_2$), $O_2$ plasma, and $H_2O$ plasma. The nitrogen precursor may be one selected from the group consisting of nitrogen ($N_2$), ammonia ($NH_3$), $N_2$ plasma, $NH_3$ plasma, nitrogen dioxide ($NO_2$), $NO_2$ plasma, $N_2O$, and $N_2O$ plasma. Also, the ALD technique may be one selected from the group consisting of a traveling wave reactor type ALD technique, a remote plasma ALD technique, and a direct plasma ALD technique. Further, the substrate may be one selected from the group consisting of a glass substrate, a metal foil substrate, a silicon (Si) substrate, and a plastic substrate.

Yet another aspect of the present invention provides a TFT including: a gate electrode disposed on a substrate; a p-type ZnO semiconductor layer manufactured by the above-described method, the p-type ZnO semiconductor layer being disposed on or under the gate electrode; source and drain electrodes electrically connected to the p-type ZnO semiconductor layer; and a gate insulating layer interposed between the gate electrode and the p-type ZnO semiconductor layer.

Each of the gate electrode, the source electrode, and the drain electrode may include at least one layer, which is formed of at least one selected from the group consisting of indium tin oxide (ITO), indium zinc oxide (IZO), ZnO:Al, ZnO:Ga, NiO, Ag, Au, Al, Al/Nd, Cr, Al/Cr/Al, Ni, and Mo. The gate insulating layer may be a single inorganic insulating layer, a multilayered inorganic insulating layer, a single organic insulating layer, a multilayered organic insulating layer, or an organic-inorganic hybrid layer. The inorganic insulating layer may be formed of one selected from the group consisting of $SiN_X$, AlON, $TiO_2$, $AlO_X$, $TaO_X$, $HfO_X$, SiON, and $SiO_X$.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 3 is a flowchart illustrating a process of manufacturing a p-type ZnO semiconductor layer according to another exemplary embodiment of the present invention.

DETAILED DESCRIPTION OF EMBODIMENTS

The present invention will now be described more fully hereinafter with reference to the accompanying drawings, in which exemplary embodiments of the invention are shown.

Figure 1:
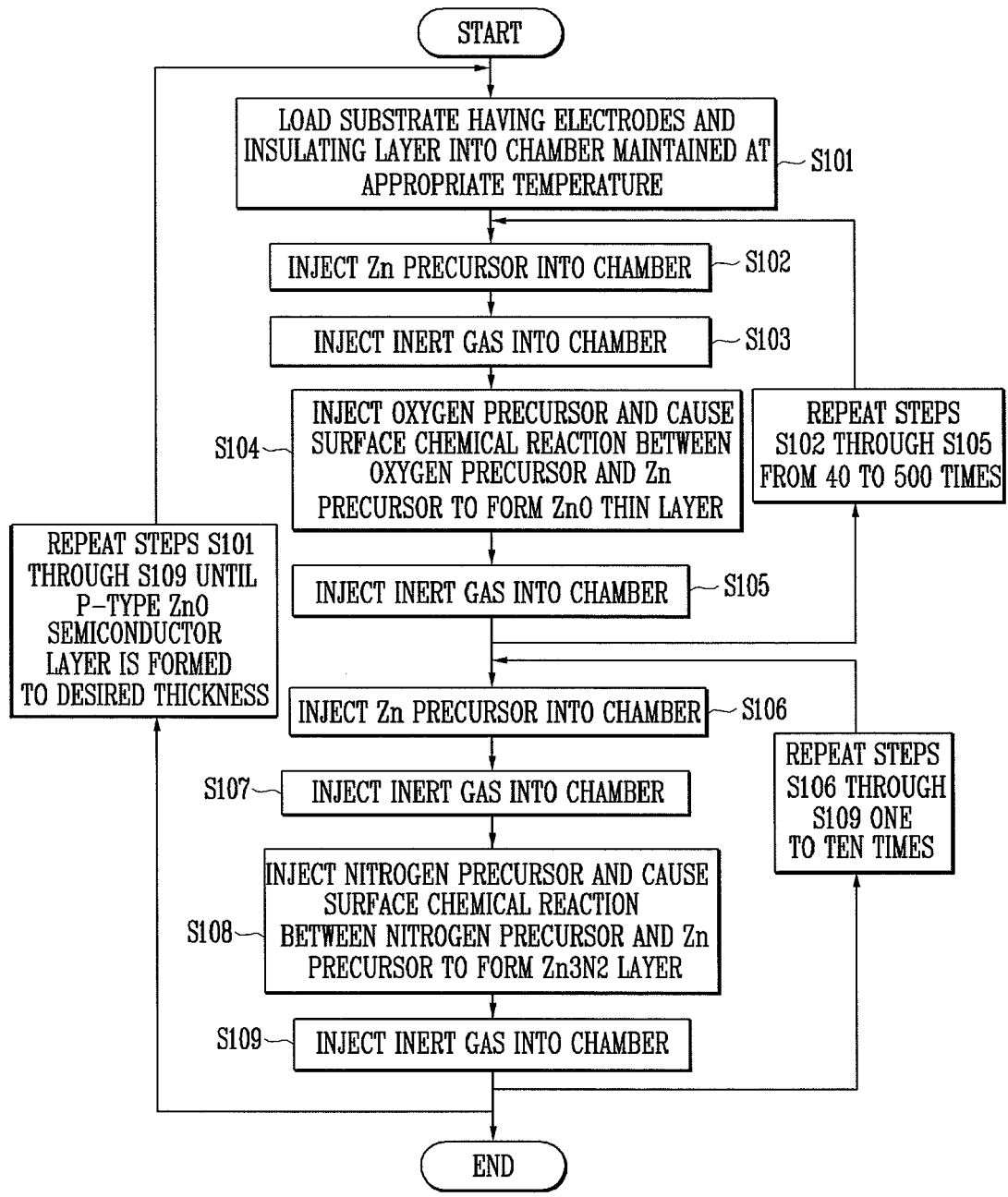
FIG. 1 is a flowchart illustrating a process of manufacturing a p-type ZnO semiconductor layer according to an exemplary embodiment of the present invention.
Figure 2:
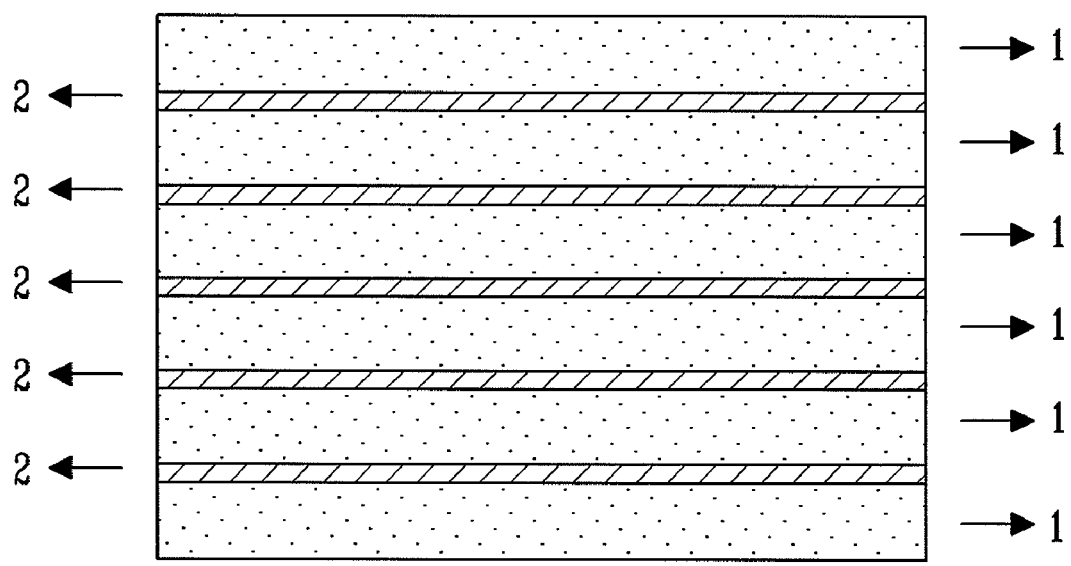
FIG. 2 is a cross-sectional view of a p-type ZnO semiconductor layer manufactured using the process shown in FIG. 1.

FIG. 1 is a flowchart illustrating a process of manufacturing a p-type ZnO semiconductor layer according to an exemplary embodiment of the present invention, and FIG. 2 is a cross-sectional view of a p-type ZnO semiconductor layer manufactured using the process shown in FIG. 1.

Referring to FIG. 1, in order to manufacture the p-type ZnO semiconductor layer according to the present invention, initially, a substrate is loaded into a chamber of an atomic layer deposition (ALD) apparatus in step S101. The chamber is maintained at a temperature of about 40 to 350° C., and electrodes and an insulating layer are stacked on the substrate loaded in the chamber.

In the present invention, an ALD technique includes alternating a process of chemisorbing molecules on the surface of a substrate using a chemical combination and a process of causing substitution, combustion, and protonation reactions between an adsorbed precursor and a subsequent precursor using a surface chemical reaction. That is, the ALD technique includes repeating a cycle including the chemisorption reaction and the substitution reaction, thereby enabling hyperfine layer-by-layer deposition and minimizing formation of defects in the oxide film. ALD techniques used for forming a semiconductor layer may be largely classified into a traveling wave reactor type ALD technique and a plasma-enhanced ALD technique. Also, the plasma-enhanced ALD technique may be divided into a remote plasma ALD (or a downstream plasma ALD) technique and a direct plasma ALD technique according to the type of plasma generator. Since the present invention is not affected by the type of ALD technique, any one of the foregoing ALD techniques can be employed.

After loading the substrate into the chamber, a Zn precursor is injected into the chamber in step S102. As a result, the Zn precursor is adsorbed on the surface of the substrate. The Zn precursor may be one selected from the group consisting of diethyl zinc and dimethyl zinc. In the current embodiment, any one of diethyl zinc and dimethyl zinc may be used as the Zn precursor.

Thereafter, an inert gas is injected into the chamber in step S103 to remove an unadsorbed Zn precursor. The inert gas may be one selected from the group consisting of He gas, Ne gas, Ar gas, Kr gas, Xe gas, and Rn gas. In the present embodiment, Ar gas is injected into the chamber, thereby removing all unadsorbed molecules of a Zn precursor reactant from the surface of the substrate.

After removing the entire unadsorbed Zn precursor, an oxygen precursor is injected into the chamber in step S104. The oxygen precursor may be one selected from the group consisting of water ($H_2O$), ozone ($O_3$), oxygen ($O_2$), $O_2$ plasma, and $H_2O$ plasma. In the present embodiment, while $O_2$ gas is being injected into the chamber, radio-frequency (RF) power is applied at the same time to generate $O_2$ plasma, so that the $O_2$ plasma is used as the $O_2$ precursor. A surface chemical reaction is caused between the generated $O_2$ plasma and the Zn precursor adsorbed on the surface of the substrate, thereby forming a ZnO (or ZnO intermediate) thin layer.

In step S105, an inert gas is injected into the chamber to remove an unadsorbed $O_2$ precursor. The inert gas may be one selected from the group consisting of He gas, Ne gas, Ar gas, Kr gas, Xe gas, and Rn gas. In the present embodiment, Ar gas is injected into the chamber, thereby removing the remaining unreacted oxygen precursor and volatile products containing the remaining oxygen precursor.

When steps S102 through S105 are performed once, a ZnO thin layer is formed using an ALD technique. However, in order to obtain suitable thickness of a high-quality ZnO thin layer including neither unadsorbed Zn molecules nor oxygen vacancies, steps S102 through S105 may be repeated forty to five-hundred times.

When steps S102 through S105 are repeated a desired number of times, a Zn precursor is injected into the chamber in step S106. The injected Zn precursor is adsorbed on the surface of the substrate having the ZnO thin layer due to a surface chemical reaction. As in step S102, one selected from the group consisting of diethyl zinc and dimethyl zinc is used as the Zn precursor. Thereafter, an inert gas is injected into the chamber in step S107, thereby removing the unadsorbed Zn precursor. The inert gas may be one selected from the group consisting of He gas, Ne gas, Ar gas, Kr gas, Xe gas, and Rn gas. In the present embodiment, Ar gas is injected into the chamber, thereby removing all unadsorbed molecules of a Zn precursor from the surface of the ZnO semiconductor layer.

In step S108, an nitrogen precursor is injected into the chamber. In this case, the nitrogen precursor may be one selected from the group consisting of ammonia ($NH_3$) and $NH_3$ plasma. In the current embodiment, while $NH_3$ gas is being injected into the chamber, RF power is applied at the same time to generate $NH_3$ plasma, so that the $NH_3$ plasma can be used as the nitrogen precursor. A surface chemical reaction is caused between the generated $NH_3$ plasma and the Zn precursor adsorbed on the substrate having the ZnO thin layer, thereby forming a $Zn_3N_2$ layer.

Thereafter, an inert gas is injected into the chamber to remove an unadsorbed nitrogen precursor in step S109. The inert gas may be one selected from the group consisting of He gas, Ne gas, Ar gas, Kr gas, Xe gas, and Rn gas. In the present embodiment, Ar gas is injected into the chamber, thereby removing the remaining unreacted nitrogen precursor, volatile products containing the remaining unreacted nitrogen precursor, and the remaining by-products.

Like the process of forming the ZnO thin layer, the process of forming the $Zn_3N_2$ layer (steps S106 through S109) is also repeated a predetermined number of times. The number of times the process of forming the $Zn_3N_2$ layer is performed depends on a process temperature. That is, steps S106 through S109 may be repeated one to ten times. Since the number of times the process of forming the $Zn_3N_2$ layer is performed may also depend on an internal structure and pressure of the chamber, a ratio of the number of times the ZnO layer is formed (steps S102 through S105) to the number of times the $Zn_3N_2$ layer is formed (steps S106 through S109) may be adjusted according to the structure of the chamber, a process pressure, and the amount of the nitrogen precursor.

The deposited thickness of the p-type ZnO semiconductor layer manufactured using the ALD technique by alternating the $Zn_3N_2$ layer and the ZnO thin layer according to the above-described process steps may depend on the number of times the entire cycle including steps S102 through S109 is performed. The entire cycle is repeated until the p-type ZnO semiconductor layer is deposited to a desired thickness of, for example, 10 to 100 nm. For instance, at a process temperature of about 150° C., a cycle including a process of growing the ZnO thin layer five times and a process of growing the $Zn_3N_2$ thin layer once is performed fifty times, so that the p-type ZnO semiconductor layer is formed to a thickness of 45 nm. In this case, a deposition time taken to perform the cycle once may depend on the amounts of precursors injected. Also, the amounts of precursors injected may depend on the size of the substrate. When the ZnO thin layer is formed using ozone ($O_3$) as an oxygen precursor, an ALD apparatus may be maintained at a temperature of about 100 to 300° C., and when the ZnO thin layer is formed using $O_2$ plasma as the oxygen precursor, the ALD apparatus may be maintained at a temperature of about 40 to 300° C. Therefore, an internal temperature of the ALD apparatus may be appropriately controlled according to the type of the oxygen precursor and the type of the substrate.

FIG. 2 is a cross-sectional view of the p-type ZnO semiconductor layer manufactured by repeating steps S101 to S109 shown in FIG. 1. In the p-type ZnO semiconductor layer, a ZnO thin layer 1 and a $Zn_3N_2$ layer 2 are alternately formed. In the current embodiment, the ZnO thin layer 1 is stacked six times, and the $Zn_3N_2$ layer 2 is interposed between each pair of ZnO thin layers 1. The ZnO thin layer 1 is formed by repeating steps S102 through S105 shown in FIG. 1 plural times, and the $Zn_3N_2$ layer 2 is formed by repeating steps S106 through S109 plural times.

FIG. 3 is a flowchart illustrating a process of manufacturing a p-type ZnO semiconductor layer according to another exemplary embodiment of the present invention.

Referring to FIG. 3, in order to manufacture the p-type ZnO semiconductor layer according to the present invention, initially, a substrate is loaded into a chamber of an ALD apparatus in step S301. The chamber is maintained at a temperature of 40 to 350° C., and electrodes and an insulating layer are stacked on the substrate loaded in the chamber.

After loading the substrate into the chamber, a Zn precursor is injected into the chamber in step S302. As a result, the Zn precursor is adsorbed on the surface of the substrate. The Zn precursor may be one selected from the group consisting of diethyl zinc and dimethyl zinc. In the current embodiment, any one of diethyl zinc and dimethyl zinc may be used as the Zn precursor. The Zn precursor is injected into the chamber together with a carrier gas, such as Ar gas, or injected alone in the form of vapor.

Thereafter, an inert gas is injected into the chamber in step S303 to remove an unadsorbed Zn precursor. The inert gas may be one selected from the group consisting of He gas, Ne gas, Ar gas, Kr gas, Xe gas, and Rn gas. In the present embodiment, Ar gas is injected into the chamber, thereby removing all unadsorbed molecules of a Zn precursor reactant from the surface of the substrate.

In step S304, an oxygen precursor and an nitrogen precursor are injected into the chamber at the same time. The oxygen precursor may be one selected from the group consisting of water ($H_2O$), oxygen ($O_2$), ozone ($O_3$), $O_2$ plasma, and $H_2O$ plasma. The nitrogen precursor may be one selected from the group consisting of nitrogen ($N_2$), ammonia ($NH_3$), $N_2$ plasma, $NH_3$ plasma, nitrogen dioxide ($NO_2$), $NO_2$ plasma, $N_2O$ and $N_2O$ plasma. Specifically, while $O_2$ gas and $NH_3$ gas (or $O_2$ gas and $N_2$ gas) are being injected into the chamber at the same time, RF power is applied to generate $O_2$ plasma and $NH_3$ plasma (or $O_2$ plasma and $N_2$ plasma), so that the $O_2$ plasma and $NH_3$ plasma (or $O_2$ plasma and $N_2$ plasma) are used as the oxygen precursor and the nitrogen precursor, respectively. A surface chemical reaction is caused between the generated $O_2$ plasma and $NH_3$ plasma (or $O_2$ plasma and $N_2$ plasma) and the Zn precursor adsorbed on the surface of the substrate, thereby forming a ZnO:N layer.

In step S305, an inert gas is injected into the chamber to remove unadsorbed oxygen and nitrogen precursors. The inert gas may be one selected from the group consisting of He gas, Ne gas, Ar gas, Kr gas, Xe gas, and Rn gas. In the present embodiment, Ar gas is injected into the chamber, thereby removing the remaining unreacted $O_2$ and $N_2$ precursors and volatile products containing the remaining O2 and N2 precursors.

When steps S302 through S305 are performed once, a p-type ZnO thin layer is formed using an ALD technique. However, in order to obtain suitable thickness of a high-quality ZnO thin layer including neither unadsorbed Zn molecules nor oxygen vacancies, steps S302 through S305 may be repeated plural times until an N-doped p-type ZnO semiconductor layer is formed to a thickness of, for example, about 8 to 100 nm.

According to the current embodiment of the present invention, a highly reproducible and stable N-doped p-type ZnO semiconductor layer can be manufactured so that the transition from the p-type ZnO semiconductor layer to an n-type semiconductor layer can be prevented. During the deposition of the ZnO semiconductor layer using an ALD technique, the occurrence of defects caused by oxygen vacancies and the interstitial Zn ions can be reduced, thereby minimizing the influence of oxygen, water, and hydrogen on the ZnO semiconductor layer.

FIGS. 4A through 4D are cross-sectional views of thin film transistors (TFTs) including a p-type ZnO semiconductor layer according to various exemplary embodiments of the present invention.

Figure 4A:
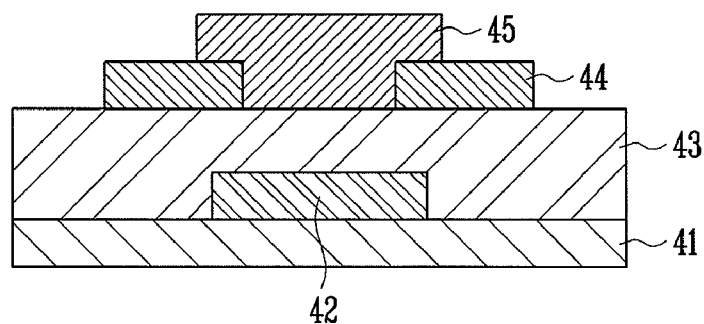
FIGS. 4A through 4D are cross-sectional views of thin film transistors (TFTs) including a p-type ZnO semiconductor layer manufactured according to various exemplary embodiments of the present invention.

FIG. 4A is a cross-sectional view of a bottom-gate inverted planar type TFT in which a gate electrode 42 and source and drain electrodes 44 are formed under a semiconductor layer 45. The bottom-gate inverted planar type TFT includes the gate electrode 42, a gate insulating layer 43, the source and drain electrodes 44, and the semiconductor layer 45, which are sequentially formed on a substrate 41. The semiconductor layer 45 corresponds to a p-type ZnO semiconductor layer manufactured according to the process shown in FIG. 1 or 3 by use of a surface chemical reaction between a Zn precursor and an oxygen precursor and between the Zn precursor and an nitrogen precursor that constitute thin layers.

The gate electrode 42 may be formed of a transparent oxide selected from the group consisting of indium tin oxide (ITO), indium zinc oxide (IZO), ZnO:Al, and ZnO:Ga, or a low-resistance metal selected from the group consisting of ITO/Ag/ITO, Ag, Au, Al, Al/Nd, Cr, Al/Cr/Al, Ni, and Mo. The gate insulating layer 43 may be one selected from the group consisting of a single inorganic insulating layer, a multilayered inorganic insulating layer, a single organic insulating layer, a multilayered organic insulating layer, and an organic-inorganic hybrid layer. Here, the inorganic insulating layer may be formed of one selected from the group consisting of $SiN_X$, AlON, $TiO_2$, $AlO_X$, $TaO_X$, $HfO_X$, SiON, and $SiO_X$.

The above-described gate insulating layer 43 may be formed of a metal having an etch selectivity with respect to an insulating layer in order to perform a process of etching the insulating layer. Also, when the gate insulating layer 43 is formed to have a double structure, an inorganic insulating layer formed of an oxide may be formed to contact the ZnO semiconductor layer 45. When the gate insulating layer 43 has an organic-inorganic hybrid structure, stress caused by warping of the structure can be removed during manufacture of a flexible TFT array, and a plastic substrate can be easily used because the gate insulating layer 43 can be formed at low temperatures.

The source and drain electrodes 44 may be formed of a transparent oxide selected from the group consisting of ITO, IZO, ZnO:Al(Ga), and NiO, which has about the same work function as ZnO, or a metal, such as one selected from the group consisting of Al, Cr, Au, Ag, Ti, and Mo. Also, the source and drain electrodes 44 may have a metal-oxide double structure.

Figure 4B:
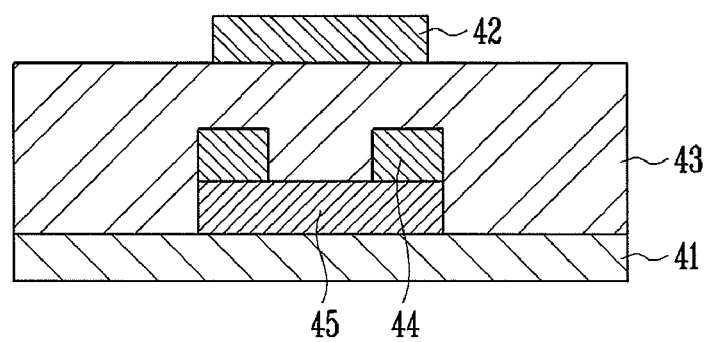
Figure 4C:
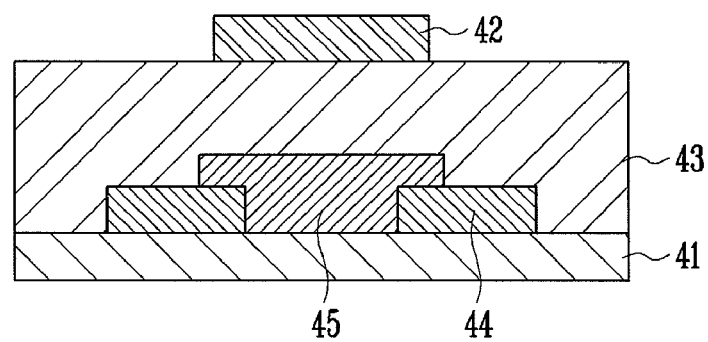
Figure 4D:
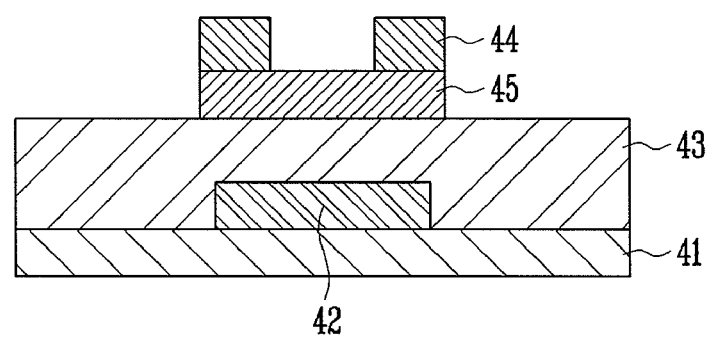

FIG. 4B is a cross-sectional view of a top-gate planar type TFT in which source and drain electrodes 44, a gate insulating layer 43, and a gate electrode 42 are formed on a semiconductor layer 45. FIG. 4C is a cross-sectional view of a top-gate staggered type TFT in which source and drain electrodes 44 are formed under a semiconductor layer 45 and a gate electrode is formed on the semiconductor layer 45. FIG. 4D is a cross-sectional view of a bottom-gate inverted staggered type TFT in which source and drain electrodes are formed on a semiconductor layer 45. The p-type ZnO semiconductor layers described with reference to FIGS. 1 and 2 can be applied to all kinds of TFTs. In FIGS. 4B through 4C, the same reference numerals are used to denote the same elements as in FIG. 4A, and thus a detailed description thereof is omitted. Therefore, materials and structures of the respective elements of FIGS. 4B through 4C will be understood with reference to FIG. 4A.

Although a TFT including a p-type ZnO semiconductor layer (hereinafter, a p-type ZnO TFT) is described in detail in the current embodiment, a variety of photoelectric devices can be manufactured by bonding the p-type ZnO semiconductor layer according to the present invention to an n-type semiconductor layer, and complementary metal oxide semiconductor (CMOS) devices can be manufactured using the p-type ZnO semiconductor layer according to the present invention. Furthermore, an active matrix display device can be manufactured using an array including a p-type ZnO TFT according to the present invention, and the p-type ZnO TFT according to the present invention can be applied to RFIDs, CMOS devices, ring oscillators, inverters, sensors, or PN junction devices.

As described above, a p-type ZnO semiconductor layer is formed using an atomic layer deposition (ALD) technique, so that a TFT including the p-type ZnO semiconductor layer can be formed on a large-area glass or plastic substrate. Also, even if a high-temperature post-processing process is not performed, the p-type ZnO semiconductor layer can be formed to have excellent characteristics.

Furthermore, the obtained p-type ZnO semiconductor layer can be used for TFT arrays having various structures, and thus it can be applied to a variety of devices, such as transparent display devices, flexible display devices, RFIDs, sensors, and integrated circuits (ICs).

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a p-type ZnO semiconductor layer for an electronic device, the method comprising the steps of:

preparing a substrate and loading the substrate into a chamber;

injecting a Zn precursor and an oxygen precursor into the chamber, and causing a surface chemical reaction between the Zn precursor and the oxygen precursor using an atomic layer deposition (ALD) technique to form a ZnO thin layer on the substrate; and injecting a Zn precursor and an nitrogen precursor into the chamber, and causing a surface chemical reaction between the Zn precursor and the nitrogen precursor to form a doping layer on the ZnO thin layer.

2. The method according to claim 1, wherein the step of forming the ZnO thin layer comprises the steps of:

a1) injecting the Zn precursor into the chamber to adsorb the Zn precursor on the substrate;

a2) injecting an inert gas into the chamber to remove the remaining unadsorbed Zn precursor from the substrate;

a3) injecting the oxygen precursor into the chamber, and causing a reaction between the oxygen precursor and the Zn precursor adsorbed on the substrate to form the ZnO thin layer;

a4) injecting an inert gas into the chamber to remove the remaining unreacted oxygen precursor; and a5) repeating steps a1) through a4) plural times.

3. The method according to claim 2, wherein step a5) is repeated forty to five-hundred times.

4. The method according to claim 2, wherein the step of forming the doping layer on the ZnO thin layer comprises the steps of:

b1) injecting the Zn precursor on the substrate having the ZnO thin layer to adsorb the Zn precursor on the ZnO thin layer;

b2) injecting an inert gas into the chamber to remove the remaining unadsorbed Zn precursor;

b3) injecting an nitrogen precursor into the chamber, and causing a reaction between the nitrogen precursor and the Zn precursor adsorbed on the ZnO thin layer to form a $Zn_3N_2$ layer;

b4) injecting an inert gas into the chamber to remove the remaining unreacted nitrogen precursor; and b5) repeating steps b1) through b4) one to ten times.

5. The method according to claim 4, wherein steps a1) through a5) and steps b1) through b5) are repeated until the sum of the thicknesses of the ZnO thin layer and the $Zn_3N_2$ doping layer reaches about 8 to 100 nm.

6. The method according to claim 1, wherein the Zn precursor is one selected from the group consisting of diethyl zinc and dimethyl zinc.

7. The method according to claim 1, wherein the oxygen precursor is one selected from the group consisting of water ($H_2O$), ozone ($O_3$), oxygen ($O_2$), $O_2$ plasma, and $H_2O$ plasma.

8. The method according to claim 1, wherein the nitrogen precursor is one selected from the group consisting of nitrogen ($N_2$), ammonia ($NH_3$), $N_2$ plasma, $NH_3$ plasma, nitrogen dioxide ($NO_2$), $NO_2$ plasma, $N_2O$ and $N_2O$ plasma.

9. The method according to claim 1, wherein the ALD technique is one selected from the group consisting of a traveling wave reactor type ALD technique, a remote plasma ALD technique, and a direct plasma ALD technique.

10. The method according to claim 1, wherein the substrate is one selected from the group consisting of a glass substrate, a metal foil substrate, a silicon (Si) substrate, and a plastic substrate.

* * * * *